United States Patent
Lim et al.

(10) Patent No.: US 9,755,140 B2
(45) Date of Patent: Sep. 5, 2017

(54) MULTILAYERED MAGNETIC THIN FILM STACK AND NONVOLATILE MEMORY DEVICE HAVING THE SAME

(71) Applicants: SK hynix Inc., Icheon (KR); Korea University Research and Business Foundation, Seoul (KR)

(72) Inventors: Sang Ho Lim, Namyangju (KR); Tae Young Lee, Icheon (KR); Young Chan Won, Seoul (KR); Seong Rae Lee, Seoul (KR)

(73) Assignees: SK HYNIX INC., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/710,465

(22) Filed: May 12, 2015

(65) Prior Publication Data

US 2016/0099407 A1    Apr. 7, 2016

(30) Foreign Application Priority Data

Oct. 2, 2014 (KR) .......................... 10-2014-0132940

(51) Int. Cl.
| | |
|---|---|
| *H01L 43/00* | (2006.01) |
| *H01L 43/10* | (2006.01) |
| *H01L 43/08* | (2006.01) |
| *H01L 43/12* | (2006.01) |
| *H01L 27/22* | (2006.01) |

(52) U.S. Cl.
CPC .............. *H01L 43/10* (2013.01); *H01L 43/08* (2013.01); *H01L 43/12* (2013.01); *H01L 27/222* (2013.01)

(58) Field of Classification Search
CPC ................................. H01L 43/10; H01L 43/00
See application file for complete search history.

(56) References Cited

U.S. PATENT DOCUMENTS

2013/0313665 A1*  11/2013  Rhie ........................ G11C 11/16
                                                                    257/421
2015/0171316 A1*   6/2015  Park ........................ H01L 43/10
                                                                    257/421

OTHER PUBLICATIONS

S. Yuasa et al, "Giant tunnel magnetoresistance in magnetic tunnel junctions with a crystalline MGO (001) barrier", 2007, J. Phys. D: Appl. Phys., vol. 40, pp. R337-R354.*
Tae Young Lee et al., "Formation of a bcc (001)-textured CoFe layer by the insertion of an FeZr layer in multilayer-based stacks with perpendicular magnetic anisotropy", Applied Physics Express, May 12, 2014, pp. 1-4, vol. 7, No. 063002, The Japan Society of Applied Physics.

* cited by examiner

*Primary Examiner* — Daniel Whalen
*Assistant Examiner* — Suberr Chi

(57) ABSTRACT

A multilayered magnetic thin-film stack including a tunneling barrier layer; a magnetic finned layer formed on a first surface of the tunneling barrier layer; and a magnetic free layer formed on a second surface of the tunneling barrier layer, which is opposite to the first surface, wherein at least one of the magnetic finned layer and the magnetic free layer includes a FeZr alloy layer and a first magnetic layer having a (001) bcc structure between the FeZr alloy layer and the tunneling barrier layer.

18 Claims, 13 Drawing Sheets

MULTILAYERED MAGNETIC THIN FILM STACK AND NONVOLATILE MEMORY DEVICE HAVING THE SAME

BACKGROUND OF THE PRESENT INVENTION

1. Field of the Present Invention

The present invention relates to a memory technique, and more particularly, to a multilayered magnetic thin film stack and a nonvolatile memory device having the same.

2. Description of the Related Art

A magnetic random access memory (magnetic RAM or MRAM) is a non-volatile solid magnetic memory device that utilizes a giant magnetic resistance effect or tunneling magnetic resistance effect based on □ phenomenon of spin-dependent conductivity peculiar to a nano-magnetic material. Compared to a phase change RAM (PcRAM) or a resistive RAM (ReRAM), the MRAM is recently being spotlighted due to faster speed and excellent durability against repeated accesses.

A spin transfer torque MRAM (STT-MRAM), which is the most actively researched to implement the MRAM device, exhibits high speed operation, excellent power efficiency, and high-density integration, thus being a leading next-generation memory device. The SU-RAM includes a magnetic tunnel junction (MTJ) structure in which one insulation layer is interposed between two magnetic thin-films. In the MTJ structure, compared to in-plane magnetic anisotropy, perpendicular magnetic anisotropy (also referred to as PMA) features low switching-current density for inversion of magnetization and high thermal stability and is advantageous for scaling devices. Furthermore, since out-of-plane magnetization requires a large magnetic field for unmagnetization and is not energetically unfavorable, strong PMA is preferable.

The PMA may be obtained from intrinsic magneto-crystalline anisotropy of one or more magnetic layers or anisotropy based on interfacial effect (or, interfacial anisotropy) between layers. Generally, if the PMA is based on intrinsic magneto-crystalline anisotropy, high writing current is required, and high fabricating temperature equal to or above 500° C. is required for obtaining crystallinity of the magnetic thin-film. However, PMA based on the interfacial effect may be obtained via a multilayered thin-film stack which can be formed in a general sputtering operation, and may be fabricated at a relatively low temperature below or equal to 300° C., and thus perpendicular magnetization based on the interfacial effect is generally preferable.

However, the perpendicular magnetization using interfacial anisotropy is vulnerable in terms of thermal stability due to perpendicular magnetization property which can be deteriorated in post fabrication process accompanied with thermal budget. The vulnerability directly affects reliability of data storage property and data retention property, and thus solving the low thermal stability of the interfacial anisotropy is demanded.

SUMMARY OF THE PRESENT INVENTION

Embodiments of the present invention includes a reliable multilayered magnetic thin-film stack exhibiting reliable data storage property and high data retention property by improving low interfacial anisotropy and thermal stability of PMA.

Embodiments of the present invention also include a non-volatile memory device including a multilayered magnetic thin-film stack having the above-stated benefits.

According to an aspect of the present invention, there is provided a multilayered magnetic thin-film stack including a tunneling barrier layer; a magnetic pinned layer formed on a first surface of the tunneling barrier layer; and a magnetic free layer formed on a second surface of the tunneling barrier layer, which is opposite to the first surface, wherein at least one of the magnetic pinned layer and the magnetic free layer includes a FeZr alloy layer and a first magnetic layer having a (001) bcc structure between the FeZr alloy layer and the tunneling barrier layer.

The tunneling barrier layer may include aluminum oxide ($Al_2O_3$), magnesium oxide (MgO), titanium oxide ($TiO_2$), aluminum nitride (AlN), ruthenium oxide ($RuO_2$), strontium oxide (SrO), silicon nitride (SiN), calcium oxide (CaO), hafnium oxide ($HfO_2$), tantalum oxide ($Ta_2O_5$), zirconium oxide ($ZrO_2$), silicon carbide (SiC), silicon oxide ($SiO_2$), silicon oxynitride ($SiO_xN_y$) or a stack of thin films formed of two or more thereof. Atomic mole ratio of zirconium (Zr) in the FeZr alloy layer may be from about 25 atomic % to about 75 atomic %. Furthermore, average thickness of the FeZr alloy layer may be from about 0.2 nm to about 3 nm.

The first magnetic layer may include a pure iron (Fe), cobalt-iron (CoFe), cobalt-iron-boron (CoFeB), or a stacked layer containing two or more of the same. The tunneling barrier layer may include MgO (001), and the first magnetic layer includes at least one of cobalt-iron-boron (CoFeB) and cobalt-iron (CoFe).

The multilayered magnetic thin-film stack may further include second magnetic layer formed on a surface of the FeZr alloy layer opposite to the surface having formed thereon the first magnetic layer. The second magnetic layer may include a multilayered structure formed by alternately stacking a non-magnetic metal layer and a cobalt (Co)-containing magnetic layer for at least once. Preferably, the non-magnetic metal layer may include platinum (Pt). According to another embodiment, the multilayered magnetic thin-film stack may further include a Pt layer between the FeZr alloy layer and the second magnetic layer.

According to another aspect of the present invention, there is provided a multilayered magnetic thin-film stack including a first magnetic layer and a second magnetic layer adjacent to each other; and a FeZr alloy layer inserted between the first magnetic layer and the second magnetic layer, thereby structurally decoupling the first magnetic layer and the second magnetic layer from each other, and magnetically coupling the first magnetic layer and the second magnetic layer to each other.

The first magnetic layer has a (001) bcc structure, and the multilayered magnetic thin-film stack may further include a template layer for crystallization of the first magnetic layer on a surface of the first magnetic layer opposite to the surface of the first magnetic layer contacting the FeZr alloy layer. The template layer may include MgO (001).

The multilayered magnetic thin-film stack exhibits perpendicular magnetic anisotropy. Atomic mole ratio of zirconium (Zr) in the FeZr alloy layer may be from about 25 atomic % to about 75 atomic %. Furthermore, average thickness of the FeZr alloy layer is from about 0.2 nm to about 3 nm.

The first magnetic layer may include a ferromagnetic layer. Furthermore, the second magnetic layer may include an anti-ferromagnetic layer. The first magnetic layer may include at least one of CoFeB and CoFe, and the second magnetic layer may include a multilayered structure formed by alternately stacking a non-magnetic metal layer and a cobalt (Co)-containing magnetic layer for at least once.

According to an aspect of the present invention, there is provided a non-volatile memory device including the above-stated multilayered magnetic thin-film stack.

BRIEF DESCRIPTION OF THE DRAWINGS

Hereinafter, embodiments of the present invention will be described in greater detail with reference to the accompanying drawings.

FIG. 3B is a diagram showing a first comparative embodiment showing a multilayered magnetic thin-film stack without a FeZr alloy layer, whereas

DETAILED DESCRIPTION OF THE PRESENT INVENTION

Figure 1A:
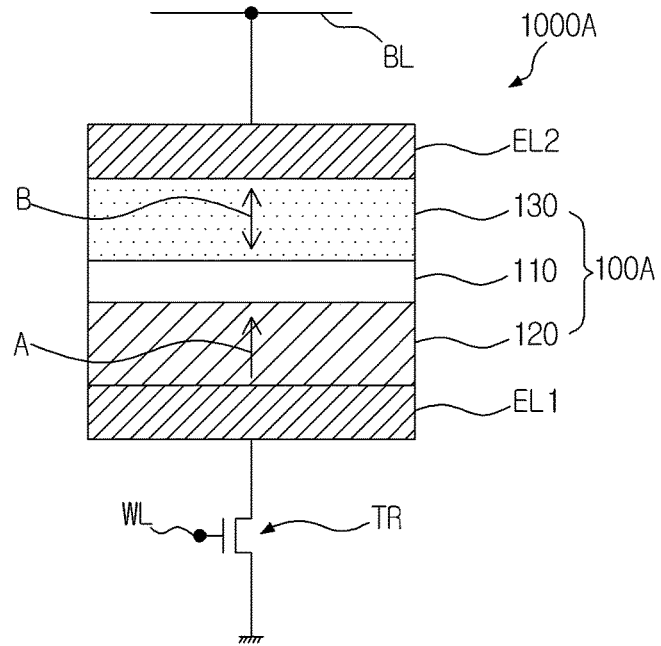
FIGS. 1A and 1B are sectional views of memory cells including magnetization perpendicular to the plane (MPP) magnetic tunneling junctions (MTJs) of the present invention, respectively.

The present invention will now be described more fully with reference to the accompanying drawings, in which exemplary embodiments of the present invention are shown.

The present invention may, however, be embodied in many different forms and should not be construed as being limited to the embodiments set forth herein; rather these embodiments are provided so that this disclosure will be thorough and complete, and will fully convey the concept of the present invention to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of explanation and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It will be understood that when a layer is referred to as being "formed on," another layer, it can be directly formed on the other layer or intervening layers may be present therebetween. Likewise, when a material is referred to as being adjacent to another material, intervening materials may be present therebetween. In contrast, when a layer or material is referred to as being "directly" formed on, to another layer or material or as being "directly" adjacent to or contacting another layer or material, there are no intervening materials or layers therebetween.

The present invention will now be described more fully with reference to the accompanying drawings, in which exemplary embodiments of the invention are shown. In the drawings, for example, sizes and shapes of members may be exaggerated for clarity and convenience of explanation. Accordingly, the shapes may be modified actually. Accordingly, it should not be construed as being limited to specific shapes of regions.

The term "substrate" used herein includes a bulk type supporting structure such as silicon, silicon-on-insulator (SOI), or silicon-on-semiconductor (SOS), and is not limited thereto. The term "substrate" may also include, a semiconductor layer, a doped or undoped semiconductor layer, and a strained semiconductor layer. Also, the term "semiconductor" is not limited to a silicon-based material and may refer to carbon, a polymer, silicon-germanium, germanium, a group III-V semiconductor material such as a gallium-arsenic-based compound, a group II-VI semiconductor material such as a indium-oxygen, or a mixed semiconductor material. The term "non-semiconductor" may refer to an insulating ceramic material, a metal, or a polymer material, but is not limited thereto.

Figure 1B:
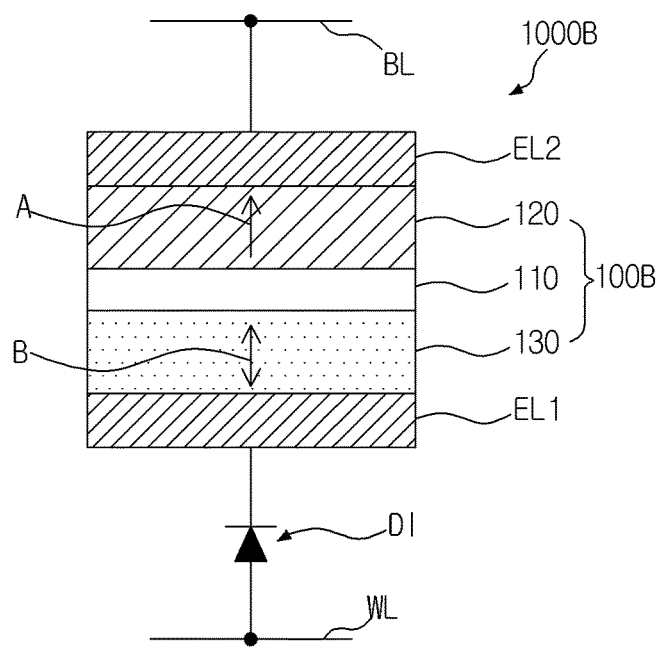

FIGS. 1A and 1B are sectional views of memory cells 1000A and 1000B including magnetization perpendicular to the plane (MPP) magnetic tunneling junctions (MTJs) 100A and 100B according to embodiments of the present invention, respectively.

Referring to FIG. 1A, the memory cell 1000A is a data storage element and may constitute a unit storage node of non-volatile magnetic memory devices. A selecting device for selecting a cell, e.g., a transistor TR, may be attached to an end of the MTJ 100A of the memory cell 1000A. A gate of the transistor TR may be electrically connected to a first wiring, e.g., a word line WL. The other end of the MTJ 100A may be electrically connected to a bit line BL, for example. The memory cell 1000A may further include suitable electrodes EL1 and EL2 that are coupled to the word line WL and the bit line BL, respectively. The transistor TR is an unlimited example for the selecting device and may be a field effect transistor or a bipolar transistor. Alternatively, the selecting device may be a nano switching device using graphene or nano effect.

Referring to FIG. 1B, a selecting device for addressing the memory cell 1000B according to another embodiment of the present invention may include a diode DI serially connected to MTJ 100B. The diode DI shown in FIG. 1B may be a PN junction diode. According to another embodiment of the present invention, the selecting device may be any device capable of addressing a memory cell based on an electrical potential difference between a word line WL and a bit line BL together with or without a PN junction diode DI. For example, another selecting device may be a diode with reversed polarities or a bidirectional diode having bidirectional rectifying property for unidirectional switching. According to another embodiment, for high density integration of a memory device, enhancement of an ON current of the selecting device, or multi-bit operation, the diode DI may include a Schottky barrier diode DI, a Zener diode, a p type semiconductor-intrinsic semiconductor-n type semiconductor (p-i-n) junction diode combined with an intrinsic semiconductor layer, or a p-type semiconductor-intrinsic semiconductor-metal (pim) type diode combined with a metal layer.

The bit lines BL and the word lines WL may form a plurality of stripe patterns including a plurality of lines extending in directions different from (e.g., perpendicular to) one another. The MTJ 100A and the MTJ 100B may be arranged at each of cross points at which the stripe patterns intersect each other, and memory cells may be addressed via the selecting devices. According to an embodiment of the present invention, memory cells may have a cross-point array structure satisfying $4F^2$ integration. Alternatively, an array of memory cells is not limited to 2-dimensional (2D) planar structure and may have a 3-dimensional (3D) structure in which two or more planar arrays are stacked in a direction perpendicular to a substrate or a 3D structure obtained by forming a channel layer extending in a direction perpendicular to a substrate.

Each of the MTJs 100A and 100B forming a memory cell may include a tunneling barrier layer 110, a magnetic pinned layer 120, and a magnetic free layer 130. According to other embodiment of the present invention, the magnetic pinned layer 120 and the magnetic free layer 130 may be inversely stacked while sandwiching the tunneling barrier layer 110 as shown in FIGS. 1A and 1B. The unidirectional arrow A indicates that the magnetic pinned layer 120 has fixed magnetization, whereas the bidirectional arrow B indicates that the magnetic free layer 130 may be magnetized in a direction parallel to or antiparallel to a magnetization direction of the magnetic pinned layer 120. According to an embodiment, magnetization direction of the magnetic free layer 130 may be changed by adjusting a direction of a tunneling current with spin torque flowing through the MTJs 100A and 100B.

The magnetic pinned layer 120 and the magnetic free layer 130 has perpendicular magnetic anisotropy (PMA). Although not shown, a tunneling barrier layer and a magnetic pinned layer may be additionally stacked on the magnetic free layer 130, thereby providing a symmetrical MTJ in which two magnetic pinned layers are arranged to face each other while sandwiching the magnetic free layer 130. By such a symmetrical MTJ, direction of currents for program and erase operation may be rendered as single direction.

Figure 2A:
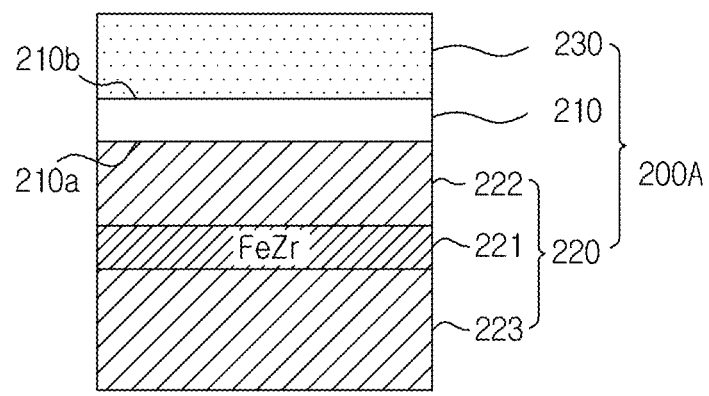
FIGS. 2A and 2B are sectional views of MTJs according to embodiments of the present invention.
Figure 2B:
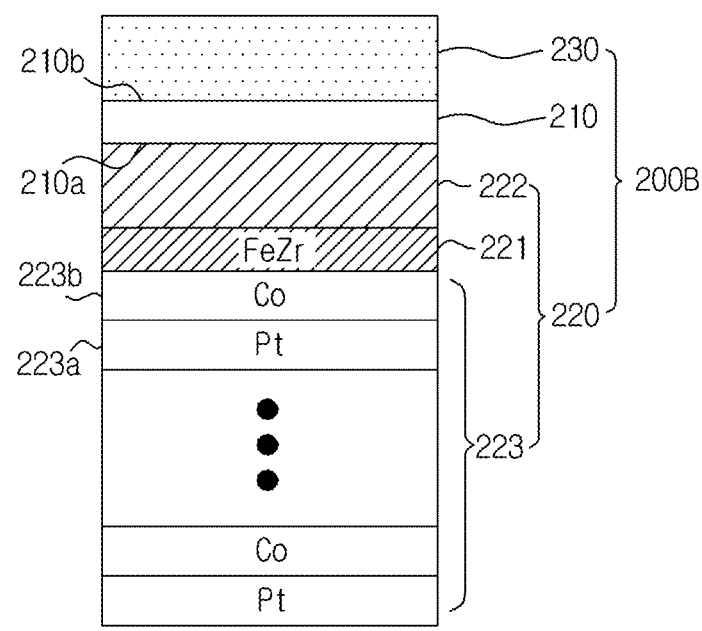
Figure 2C:
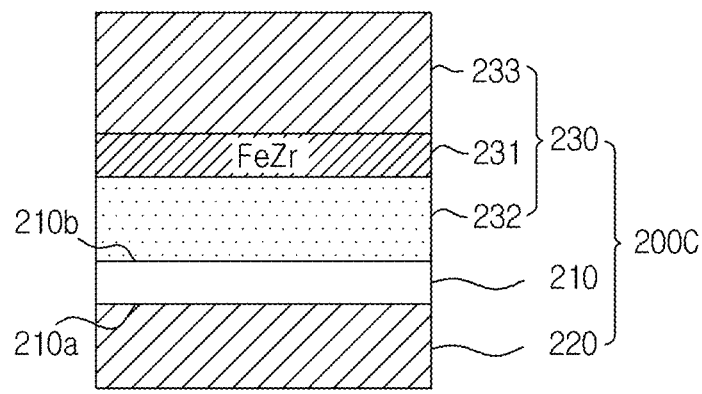
FIG. 2C is a sectional view of a MTJ according to another embodiment of the present invention.

FIGS. 2A and 2B are sectional views of MTJs 200A and 200B according to embodiments of the present invention, and FIG. 2C is a sectional view of a MTJ 200C according to another embodiment of the present invention.

Referring to FIG. 2A, the MTJ 200A includes a tunneling barrier layer 210, a magnetic pinned layer 220 arranged on a first surface 210a of the tunneling barrier layer 210, and a magnetic free layer 230 arranged on a second surface 210b of the tunneling barrier layer 210. The magnetic pinned layer 220 and the magnetic free layer 230 may be inversely stacked while sandwiching the tunneling barrier layer 210 as described above. Each of the tunneling barrier layer 210 and the magnetic free layer 230 may include a single magnetic layer, a stack of different types of magnetic layers, or a stack of a magnetic layer and a non-magnetic layer. Detailed descriptions thereof will be given below.

For example, the tunneling barrier layer 210 may include aluminum oxide ($Al_2O_3$), magnesium oxide (MgO), titanium oxide ($TiO_2$), aluminum nitride (AlN), ruthenium oxide ($RuO_2$), strontium oxide (SrO), silicon nitride (SiN), calcium oxide (CaO), hafnium oxide ($HfO_2$), tantalum oxide ($Ta_2O_5$), zirconium oxide ($ZrO_2$), silicon carbide (SiC), silicon oxide ($SiO_2$), silicon oxynitride ($SiO_xN_y$) or a stack of thin films formed of two or more of the same. Preferably, the magnetic pinned layer 220 may include a NaCl type crystalline MgO (001) layer. The MgO (001) layer may be a monocrystalline layer or a polycrystalline layer. In an embodiment of the present invention, the MgO (001) has a preferentially oriented (001) crystal surface.

At least one of the magnetic pinned layer 220 and the magnetic free layer 230 may include a FeZr alloy layer 221 and a first magnetic layer 222, which has a body-centered cubic (bcc) structure preferentially oriented in a direction of (001) (referred to hereinafter as (001) bcc) and arranged between the FeZr alloy layer 221 and the tunneling barrier layer 210. As an unlimited example, a multilayered magnetic thin-film stack shown in FIG. 2A relates to an embodiment in which the magnetic pinned layer 220 includes the FeZr alloy layer 221 and the first magnetic layer 222.

Atomic mole ratio of Zr in the FeZr alloy layer 221 may be from about 25 atomic % to about 75 atomic %. If atomic mole ratio of Zr in the FeZr alloy layer 221 is below 25 atomic %, Zr effect is insignificant, and thus structural decoupling effect between layers adjacent to each other hardly occurs. On the other hand, if atomic mole ratio of Zr in the FeZr alloy layer 221 is above 75 atomic %, no magnetic coupling may occur between layers adjacent to each other. However, any of other composition ratios for stably maintaining amorphous state of the FeZr alloy layer 221 may be selected without departing from the scope of the present invention.

Average thickness of the FeZr alloy layer 221 may be from about 0.2 nm to about 3.0 nm. If the average thickness of the FeZr alloy layer 221 is smaller than 0.2 nm, continuous thin-films may not be formed on a underlying layer. If the average thickness of the FeZr alloy layer 221 exceeds 3.0 nm, no magnetic coupling may be provided between layers adjacent to each other or PMA property of a multilayered magnetic thin-film stack may be drastically deteriorated. Detailed descriptions thereof will be given below.

The first magnetic layer 222 may include a ferromagnetic layer having coercive force. The ferromagnetic layer may contain a pure iron (Fe), cobalt-iron (CoFe), cobalt-iron-boron (CoFeB), or a stacked layer containing two or more of the same (e.g., a CoFeB layer/Fe layer and a Fe layer/CoFeB layer). Preferably, the ferromagnetic layer may contain cobalt-iron-boron (CoFeB).

The first magnetic layer 222 is amorphous as the first magnetic layer 222 is formed. However, the first magnetic layer 222 may be transformed to a (001) bcc structure via a post annealing process. As described below, the FeZr alloy layer 221 maintains an amorphous structure even after the annealing process at a temperature of about 500° C., thereby contributing formation of a (001) bcc structure. In some embodiments of the present invention, the FeZr alloy layer 221 may be partially crystallized. In this case, the FeZr alloy layer 221 may include a mixed crystalline phase having bcc Fe (001) and hexagonal crystal system (referred to hereinafter as 'hcp') Zr (001). Even if the first magnetic layer 222 has an amorphous structure as the first magnetic layer 222 is formed, the first magnetic layer 222 may experience a dominant template effect due to the tunneling barrier layer 210 with which the first magnetic layer contacts during a post annealing process at a predetermined temperature. For example, if the tunneling barrier layer 210 is a MgO (001) layer, the MgO (001) layer functions as a template layer, and thus the first magnetic layer 222 may be crystallized to have a (001) bcc structure and may be stably maintained.

A second magnetic layer 223 may be formed on a surface of the FeZr alloy layer 221 opposite to the surface of the FeZr alloy layer 221 having formed thereon the first magnetic layer 222. The second magnetic layer 223 may be magnetically coupled to the first magnetic layer 222 via the FeZr alloy layer 221. The second magnetic layer 223 may include any layer that may be magnetically attached to the first magnetic layer 222. In the stacked structure of the first magnetic layer 222, the second magnetic layer 223 and the FeZr alloy layer 221, the FeZr alloy layer 221 may be also referred to as FeZr insertion layer hereafter.

Since the second magnetic layer 223 is structurally decoupled from the first magnetic layer 222 by the FeZr alloy layer 221 as described below, micro-structure of the second magnetic layer 223 may not affect that of the first magnetic layer 222. Therefore, while not limited to a particular microstructure, the second magnetic layer 223 may include any single magnetic layer, a stack of different types of magnetic layers, or a stack of a magnetic layer and a non-magnetic layer, in order to enhancing the PMA property of the MTJ 200.

According to embodiments of the present invention, the magnetic pinned layer 220 may have a stacked structure including a ferromagnetic layer and an anti-ferromagnetic layer that is adjacent to the ferromagnetic layer to obtain an interlayer exchange-coupling therebetween. In this case, the first magnetic layer 222 may include a ferromagnetic layer, whereas the second magnetic layer 223 may include an anti-ferromagnetic layer. The anti-ferromagnetic layer may contain any one of or two or more of PtMn, IrMn, MnO, MnS, MnTe, $MnF_2$, $FeCl_2$, FeO, $CoCl_2$, CoO, $NiCl_2$, and NiO. According to another embodiment of the present invention, the second magnetic layer 223 may have a synthetic-anti-ferromagnetic (SAF) structure in which a non-magnetic conductive layer, such as a ruthenium (Ru) layer, is interposed between two ferromagnetic layers. The configurations of the first magnetic layer 222 and the second magnetic layer 223 described above are merely examplary. Although the FeZr alloy layer 221 structurally debonds the first magnetic layer 222 and the second magnetic layer 223 from each other, the FeZr alloy layer 221 may also magnetically couple the first magnetic layer 222 and the second magnetic layer 223 to each other, and thus various stacked structures may be provided.

Referring to FIG. 2B, according to another embodiment of the present invention, the second magnetic layer 223 may have a multilayered structure that exhibits PMA by interfacial effect. For example, the second magnetic layer 223 may have a $[NM/Co]_N$ multilayered structure including a non-magnetic metal layer 223a and a Co-containing magnetic layer 223b. Here, 'NM' means non-magnetic, and N denotes a number of stacks and is an integer equal to or greater than 1. The multilayered structure may have a super-lattice structure of the NM metal layer 223a and the Co-containing magnetic layer 223b.

According to an embodiment of the present invention, the NM metal layer 223a may contain platinum (Pt), and the Co-containing magnetic layer 223b may have a $[Pt/Co]_N$ multilayered structure containing Co. N may be from 1 to 20. According to another embodiment of the present invention, the NM metal layer 223a may contain rhodium (Rh), hafnium (Hf), palladium (Pd), tantalum (Ta), osmium (Os), germanium (Ge), iridium (Ir), gold (Au), silver (Ag), or an alloy thereof. According to another embodiment of the present invention, the Co-containing magnetic layer 223b may contain a cobalt-containing alloy, such as CoZr, CoFe, and CoFeB.

If the close-packed growth plane of the $[NM/Co]_N$ multilayered structure 223 is a fcc (111) plane, the fcc (111) plane may be easily formed via sputtering process. Furthermore, various options based on thicknesses of layers constituting the multilayered structure, a number N of stacks, and types of NM metal layers may be provided, and thus the intensive controllability of the properties of multi-layered structure may be provided. For example, considering the PMA property of the $[NM/Co]_N$ multilayered structure 223 may be deteriorated or lost at an even low temperature of about 300° C., in order to improve low heat-resistance of the PMA property, thicknesses of layers constituting the [NM/Co]$_N$ multilayered structure 223 may be controlled to enhance the heat resistance. For example, as disclosed in Korean Patent Application No. 10-1287370 (the entire disclosure of which is incorporated herein in its entirely by reference) of the applicant, the $[NM/Co]_N$ multilayered structure 223 may have an inverted structure in which thickness of the Co-containing magnetic layer 223b is greater than that of the Pt layer 223a. In this case, the $[NM/Co]_N$ multilayered structure 223, and preferably, the inverted [Pt/Co]N multilayered structure 223 may maintain the PMA property at an even high temperature up to about 500° C., and thus PMA property of a magnetic free layer or a magnetic pinned layer including the same may be enhanced.

Although the close-packed growth plane of the second magnetic layer 223 having a [Pt/Co]$_N$ multilayered structure is a fcc (111) plane, the FeZr alloy layer 221 interposed between the second magnetic layer 223 having the [Pt/Co]$_N$ multilayered structure and the first magnetic layer 222 having a (001) bcc structure structurally decouples the first magnetic layer 222 and the second magnetic layer 223 from each other (in such a configuration, the FeZr alloy layer will also be referred to as a FeZr interposed layer). Therefore, the first magnetic layer 222 is not affected by a microstructure of the second magnetic layer 223 and may be dominantly affected from the MgO (001) tunneling barrier layer 210, which is another layer adjacent to the first magnetic layer 222.

During formation of respective layers for forming the MTJ 200B, a multilayered magnetic thin-film stack in which amorphous second magnetic layer 223/amorphous FeZr alloy layer 221/amorphous first magnetic layer 222/MgO (001) tunneling barrier layer 210/a magnetic free layer 230 are formed in the order stated, may be formed. Next, if the multilayered magnetic thin-film stack is post-annealed or indirectly annealed by a post operation (e.g., a wiring operation) accompanying with heat budget (hereinafter, all operations inducing heat treatment or annealing effect with respect to a MTJ will be referred to as post annealing), only the first magnetic layer 222 may experience a template effect due to a MgO (001) tunneling barrier layer and may not be affected by a fcc (111) plane of the second magnetic layer 223. Therefore, the amorphous first magnetic layer may be stably crystallized to have a (001) bcc structure. Herein, a layer inducing a peculiar crystal texture to an adjacent layer will be referred to as a template layer.

On the contrary, if the first magnetic layer 222 containing amorphous CoFeB and the second magnetic layer 223 including a [Pt/Co]N multilayered structure having a fcc (111) plane contact each other and are stacked without the FeZr alloy layer 221, the first magnetic layer 222 gains a bcc (110) structure, which is the close-packed growth plane, when the first magnetic layer 222 is formed or is annealed via a post annealing, based on a template effect of the second magnetic layer 223. If the first magnetic layer 222 containing CoFeB has a bcc (110) structure, tunneling magnetoresistance (TMR) ratio is deteriorated, which is not preferable.

If the first magnetic layer 222 is formed on the first surface 210a of the MgO (001) tunneling barrier layer 210, a magnetic free layer 230 may be further formed on the second surface 210b of the MgO (001) tunneling barrier layer 210 opposite to the first surface 210a, thereby providing a MTJ. The third magnetic free layer 230 may contain a ferromagnetic layer. For example, the ferromagnetic layer may contain Fe, Co, Ni, an alloy thereof (e.g., CoFe, NiFe, or CoNiFe), or an doped alloy thereof (e.g., CoX, CoNiFeX, or CoFeX; here, X may be B, Cu, Re, Ru, Rh, Hf, Pd, Pt, Ta, Os, Ge, Ir, Au, Ag, C, or a combination thereof). Alternatively, the ferromagnetic layer may contain a semi-metal ferromagnetic material, such as $Fe_3O_4$, $CrO_2$, NiMnSb, PtMnSb, and BiFeO. However, the above-stated materials are merely examples, and the present invention is not limited thereto. For example, the third magnetic layer 230 may contain another ferromagnetic material known in the art, such as Gd, Dy, $Y_3Fe_5O_{12}$, MnSb, and MnAs, or may further contain the above-stated materials with B, Cu, Re, Ru, Rh, Hf, Pd, Pt, Os, Ir, Au, Ag, C, or a combination thereof. Preferably, similarly to the first magnetic layer 222, the third magnetic layer 230 may contain a pure iron (Fe), cobalt-iron (CoFe), cobalt-iron-boron (CoFeB), or a stacked layer containing two or more of the same (e.g., a CoFeB layer/Fe layer and a Fe layer/CoFeB layer). More preferably, the third magnetic layer 230 may contain cobalt-iron-boron (CoFeB).

Similarly to the first magnetic layer 222, the third magnetic layer 230 may also have a (001) bcc structure. In addition, similarly to the first magnetic layer 222, the third magnetic layer 230 having a (001) bcc structure may be obtained via a template effect which may result from a post annealing to a MgO (001) tunneling barrier layer 210. According to embodiments of the present invention, both the third magnetic free layer 230 and the first magnetic layer 222 may be CoFe (001). In this case, high TMR may be obtained.

Referring to FIG. 2C, a MTJ 200C according to another embodiment of the present invention may include the tunneling barrier layer 210, the magnetic pinned layer 220 formed on the first surface 210a of the tunneling barrier layer 210, and the magnetic free layer 230 formed on the second surface 210b of the tunneling barrier layer 210. The magnetic pinned layer 220 may include a single magnetic layer, a stack of different types of magnetic layers, or a stack of a magnetic layer and a non-magnetic layer. The magnetic free layer 230 may include a FeZr alloy layer 231 and a first magnetic layer 232. The first magnetic layer 232 may have a body-centered cubic (bcc) structure preferentially oriented in a direction of (001) (referred to hereinafter as (001) bcc), and arranged between the FeZr alloy layer 231 and the tunneling barrier layer 210.

As described above, the first magnetic layer 232 may include a ferromagnetic layer. The first magnetic layer 232 having the (001) bcc structure may contain a pure iron (Fe), cobalt-iron (CoFe), cobalt-iron-boron (CoFeB), or a stacked layer containing two or more of the same (e.g., a CoFeB layer/Fe layer and a Fe layer/CoFeB layer). Preferably, the first magnetic layer 232 may contain cobalt-iron-boron (CoFeB).

The second magnetic layer 233 may be formed on a surface of the FeZr alloy layer 231 opposite to the surface of the FeZr alloy layer 231 having formed thereon the first magnetic layer 232. The second magnetic layer 233 may be structurally decoupled from the first magnetic layer 232 via the FeZr alloy layer 231. According to an embodiment of the present invention, the second magnetic layer 233 may have a multilayered structure including at least one super-lattice structure of a Co-containing magnetic layer and a non-magnetic (referred to hereinafter as 'NM') metal layer, the multi-layered structure of which may exhibits a PMA based on an interfacial effect. For example, the second magnetic layer 233 may include a [Pt/Co]$_N$ multilayered structure (here, N denotes a number of stacks and is an integer equal to or greater than 1) in which the NM metal layer contains Pt. As described above, the [Pt/Co]$_N$ multilayered structure may have a inverted structure in which thickness of a Co thin-film is greater than that of a Pt thin-film. Preferably, the [Pt/Co]$_N$ multilayered structure may be formed by depositing a Pt layer and, then, depositing a Co layer on the Pt layer.

According to another embodiment of the present invention, the magnetic free layer 230 may have a stacked structure including a ferromagnetic layer and an anti-ferromagnetic layer that is adjacent to the ferromagnetic layer to have an interlayer exchange-coupling. In this case, the first magnetic layer 232 may include a ferromagnetic layer, whereas the second magnetic layer 233 may include an anti-ferromagnetic layer or a synthetic anti-ferromagnetic layer. Alternatively, the first magnetic layer 232 may include an anti-ferromagnetic layer, and the second magnetic layer 233 may include a ferromagnetic layer. In this case, although the FeZr alloy layer 231 structurally decouples the first magnetic layer 232 and the second magnetic layer 233 from each other, the FeZr alloy layer 231 may also magnetically couple the first magnetic layer 232 and the second magnetic layer 233 to each other. According to another embodiment of the present invention, at least one of the first magnetic layer 232 and the second magnetic layer 233 of the magnetic free layer 230 may include a soft magnetic layer.

According to an embodiment of the present invention, if the first magnetic layer 232 is formed on the second surface 210b of the MgO (001) tunneling barrier layer 210, the third magnetic layer 233 may be further formed on the first surface 210a opposite to the second surface 210b, thereby providing the MTJ 200C. Similarly to the first magnetic layer 232, the third magnetic layer 233 may also include a ferromagnetic layer having a (001) bcc structure.

Although FIGS. 2A through 2C show that a magnetic pinned layer is formed on the first surface 210a of the tunneling barrier layer 210 and a magnetic free layer is formed on the second surface 210b of the tunneling barrier layer 210, an embodiment in which a magnetic free layer is formed on the first surface 210a and a magnetic pinned layer is formed on the second surface 210b is also within the scope of the present invention. Furthermore, although not shown, an embodiment in which a FeZr alloy layer is interposed between a magnetic free layer and a magnetic pinned layer of a MTJ is also within the scope of the present invention.

In an embodiment, before the MTJs 200A, 200B, and 200C are formed on a substrate (not shown), a seed layer may be formed on the substrate for uniform growth of magnetic layers. In other embodiment, a protective layer may be further formed on the MTJs 200A, 200B, and 200C. In another embodiment, a buffer layer may be formed between the magnetic layers. Detailed descriptions thereof will be given below. The seed layer, the buffer layer, and the protective layer may contain Au, Cu, Pd, Pt, Ta, Ru, or an alloy thereof. However, the present invention is not limited thereto.

Experiment Example 1

To confirm structural decoupling and/or magnetic coupling effect of a FeZr alloy layer of a MTJ according to an embodiment of the present invention, a multilayered magnetic thin-film stack, which includes the FeZr alloy layer and exhibits PMA, was formed on a silicon substrate having formed thereon a wet oxidized $SiO_2$ layer and various properties thereof were evaluated.

Figure 3A:
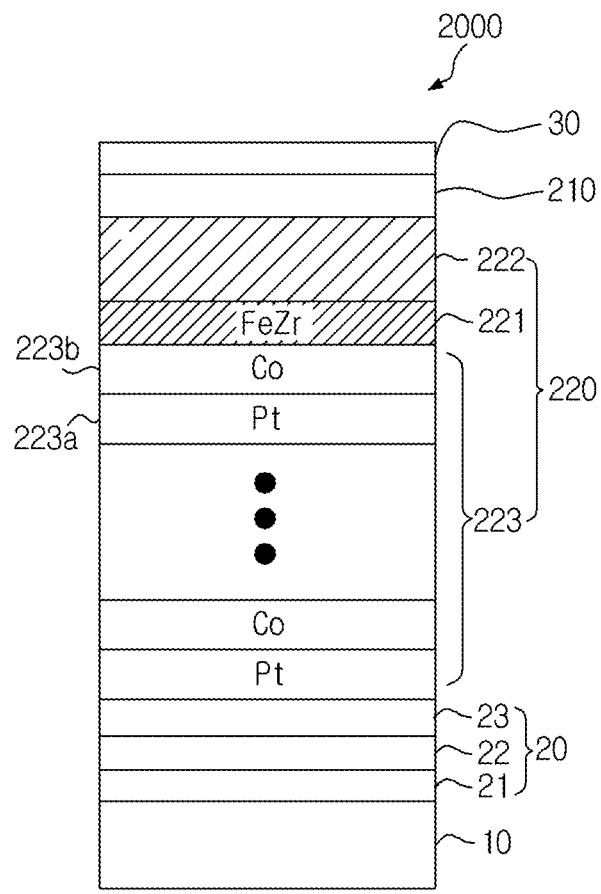
FIG. 3A is a sectional view of a multilayered magnetic thin-film stack exhibiting PMA according to an embodiment of the present invention.
Figure 3B:
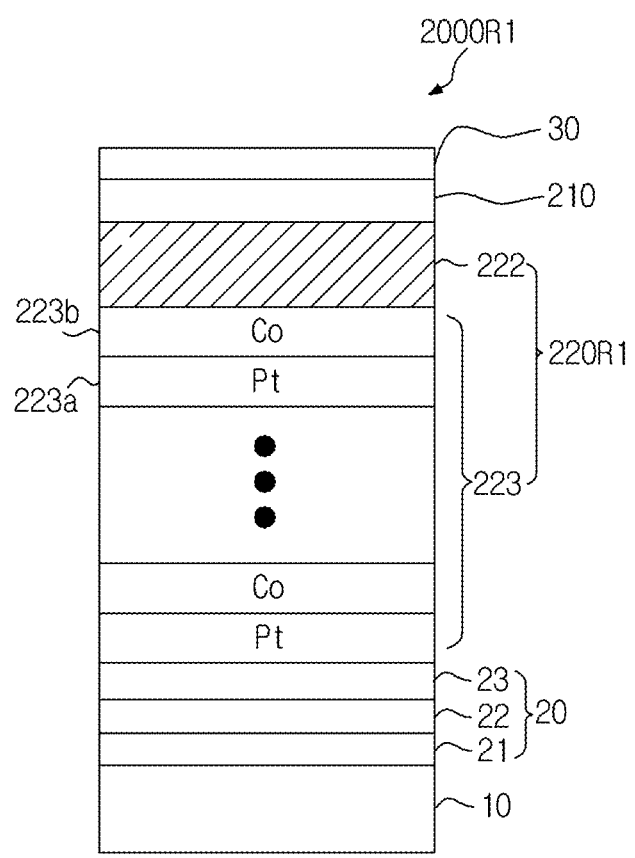

As a seed layer 20, a Ta layer 21 (thickness is 5 nm)/a Pt layer 22 (thickness is about 10 nm)/a Ru layer 23 (thickness is about 30 nm) were formed on a wet oxidized layer 10 of the silicon substrate. As a second magnetic layer (refer to 233 of FIG. 2B) for strengthening PMA [a Pt layer 223a (thickness is about 0.25 nm)/a Co layer 223b (thickness is about 0.5 nm)]$_6$ were formed. Next, a FeZr alloy layer 221 (thickness is about 1 nm; Zr content is about 50 atomic %) was formed on the resulting structure, a CoFeB magnetic layer 222 (thickness is about 1 nm or about 10 nm; a first magnetic layer)/a MgO tunneling barrier layer 210 (thickness is about 3 nm or about 10 nm) were formed thereon, and a Ru layer (thickness is about 3 nm) thereon as a protective layer, thereby forming a multilayered magnetic thin-film stack 2000 exhibiting PMA as shown in FIG. 3A. The number 6 of the second magnetic layer 223 indicates that the Pt/Co stacked structures are repeatedly stacked 6 times. FIG. 3B is a diagram showing a first comparative embodiment showing a multilayered magnetic thin-film stack 2000R1 without a FeZr alloy layer, whereas FIG. 3C is a diagram showing a second comparative embodiment result showing a multilayered magnetic thin-film stack 2000R2 in which a Ta layer 221' is applied instead of a FeZr alloy layer.

Figure 3C:
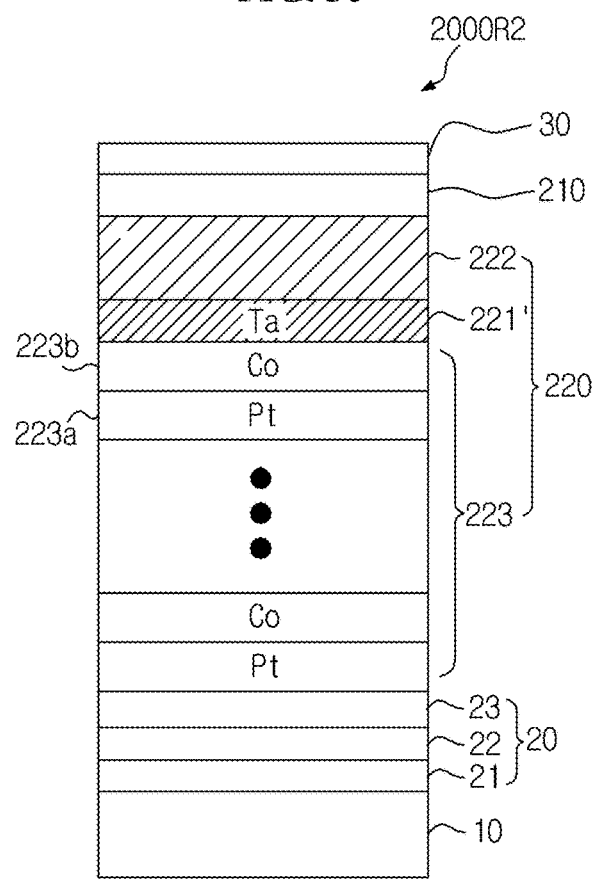
FIG. 3C is a diagram showing a second comparative embodiment showing a multilayered magnetic thin-film stack in which a Ta layer 221' is applied instead of a FeZr alloy layer.

Although the multilayered magnetic thin-film stacks 2000, 2000R1, and 2000R2 shown in FIGS. 3A through 3C are fabricated at a pressure from about $10^{-8}$ Torr to about $10^{-7}$ Torr by using a ultrahigh vacuum magnetron sputtering system including one or more chambers, the present invention is not limited thereto. During the fabrication of the multilayered magnetic thin-film stacks 2000, 2000R1, and 2000R2, intermediate resulting structure were transferred between chambers by a robot system at a predetermined pressure. Since a post annealing process is generally also performed in a later high-temperature process for fabricating a semiconductor, such as a wiring forming process, to emulate the high-temperature process, as-deposited multi-layered magnetic thin-film stacks 2000, 2000R1, and 2000R2 were annealed at a temperature from about 300° C. to about 500° C. at a vacuum atmosphere of $1\times10^{-6}$ Torr for about 1 hour.

A CoFeB magnetic layer, which is the first magnetic layer 222, was deposited by using an alloy target having a composition of $Co_{20}Fe_{60}B_{20}$, whereas a FeZr alloy layer was deposited by using an alloy target having a composition of $Fe_{50}Zr_{50}$. A MgO tunneling barrier layer 210 was deposited at a pressure of $1\times10^{-3}$ Torr (Argon atmosphere), whereas the other layers are deposited at a pressure of $2\times10^{-3}$ Torr (Argon temperature). The above-stated sputtering method is merely an example, and the present invention is not limited thereto. For example, the multilayered magnetic thin-film stacks may be formed by using another physical vapour deposition method such as an E-beam evaporation method, a chemical vapour deposition method using a suitable precursor, or an atomic layer deposition method.

A magnetization-applied magnetic field (M-H) loop was obtained by evaluating magnetic properties of the respective multilayered magnetic thin-film stack under an out-of-plane (H⊥) magnetic field and an in-plane (H∥) magnetic field by using a vibrating sample magnetometer. M was obtained by dividing a magnetic moment m by a total volume of the [Pt (0.25 nm)/Co (0.5 nm)]$_6$ magnetic layer 223 and the CoFeB magnetic layer 222.

A microstructure was observed via a transmission electron microscope (TEM) and an in-plane X-ray diffraction analysis. Furthermore, during the TEM analysis, a selected area diffraction (SAD) patterns is also analyzed.

Figure 4A:
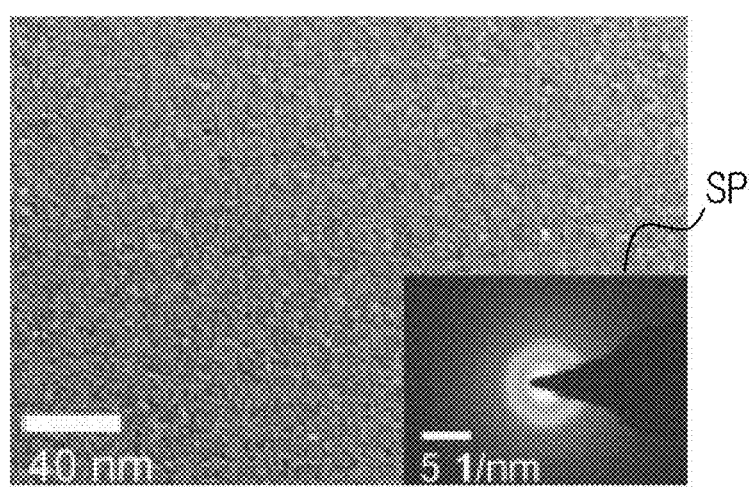
FIGS. 4A and 4B are TEM images of the as-deposited state and the annealed state (at 500° C.) of the FeZr alloy layer (thickness is about 10 nm) of FIG. 3A, and FIGS. 4C and 4D are TEM images of the as-deposited state and the annealed state (at about 300° C.) of the CoFeB magnetic layer (thickness is about 10 nm) of FIG. 3B.
Figure 4B:
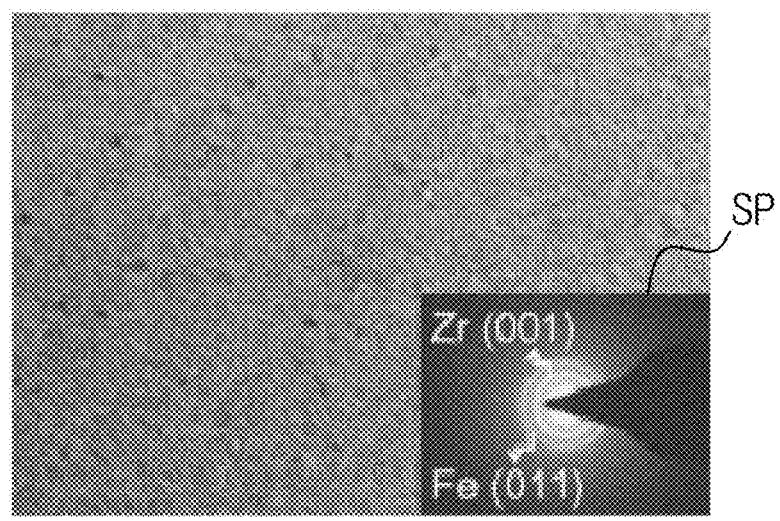
Figure 4C:
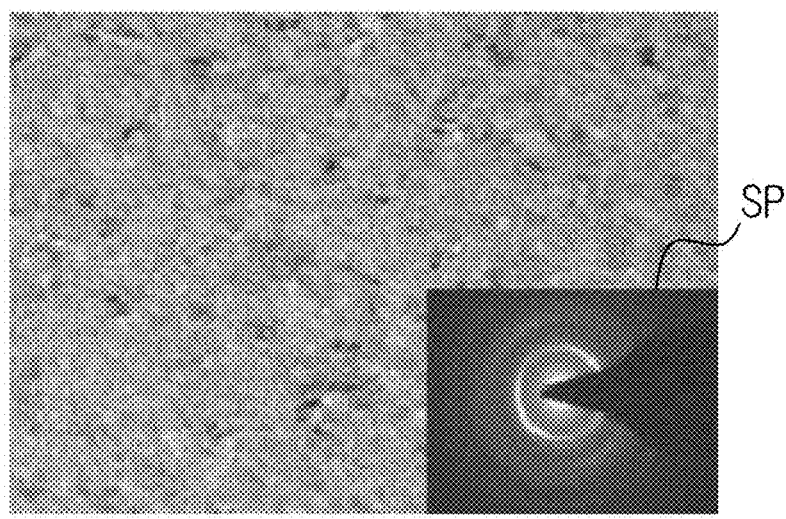
Figure 4D:
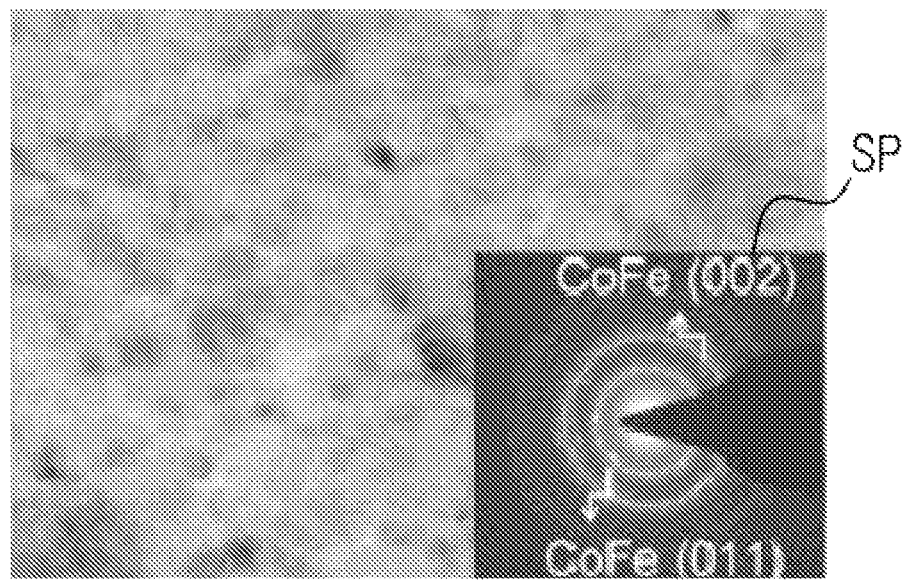

FIGS. 4A and 4B are TEM images of the as-deposited state and the heat-treated state (at 500° C.) of the FeZr alloy layer 221 (thickness is 10 nm) of FIG. 3A, and FIGS. 4C and 4D are TEM images of the as-deposited state and the heat-treated state (at 300° C.) of the CoFeB magnetic layer 222 (thickness is 10 nm) of FIG. 3B.

Referring to FIG. 4A, the as-deposited FeZr alloy layer 221 had an amorphous structure. Furthermore, referring to FIG. 4B, the FeZr alloy layer 221 maintained a substantially amorphous structure even after being annealed at a high temperature of 500° C., where a little crystallization was observed from the SAD pattern. The result is consistent with the fact that the FeZr alloy layer 221 features a high crystallizing temperature $T_x$ of about 500° C. or higher. Referring to the SAD pattern SP of the FeZr alloy layer 221 according to an embodiment of the present invention, crystal phase thereof includes a mixture of bcc Fe (011) and hcp Zr (001). If sufficient time and temperature for the annealing may be secured, an inter-metal compound, such as $Fe_2Zr$ or $Fe_2Zr_3$, may also be observed.

Referring to FIG. 4C, the as-deposited CoFeB magnetic layer 222 had an amorphous structure. However, referring to FIG. 4D, the CoFeB magnetic layer 222 deposited on a Si substrate/a SiO$_2$/Ta seed layer, which was separately fabricated to observe a change of the microstructure, and annealed at 300° C. was significantly crystallized, where crystal phase thereof includes CoFe (002) and CoFe (011) textures. Therefore, it is clear that the CoFeB magnetic layer 222 is already dominantly crystallized to bcc (011), which is the close-packed growth plane, at 300° C.

The bcc (011) structure of the CoFeB magnetic layer is not preferable due to a small TMR as described above. However, according to an embodiment of the present invention, as shown in FIG. 3A, the FeZr alloy layer 221 that structurally decouples the CoFeB magnetic layer 222 and the second magnetic layer 223 magnetically coupled thereto from each other maintains an amorphous state at a high temperature of about 500° C., thereby blocking effect from a texture of the second magnetic layer 223 and promoting template effect of the MgO tunneling barrier layer 210 on the CoFeB magnetic layer 222. As a result, the CoFeB magnetic layer 222 may have bcc (001) texture after a annealing process.

Figure 5:
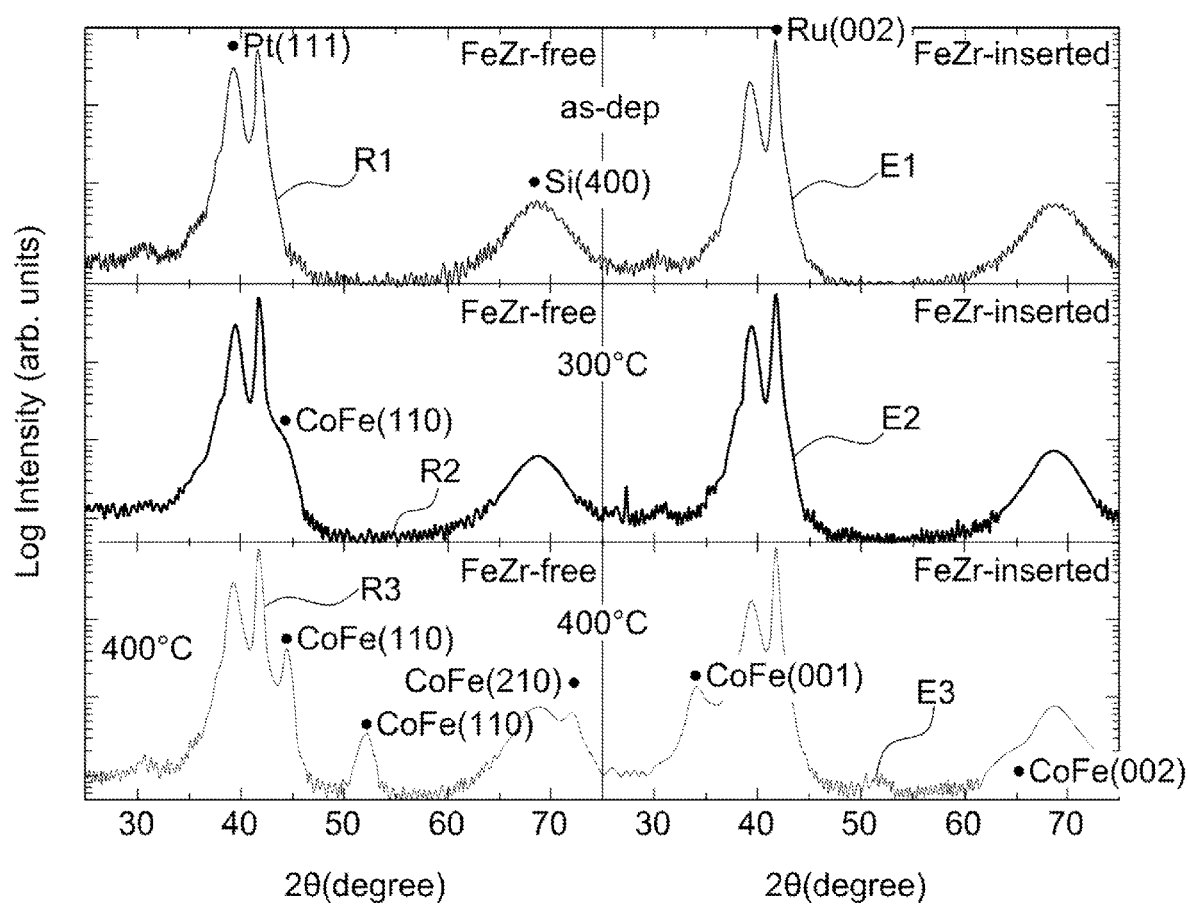
FIG. 5 is a graph showing a XRD pattern (shown at left panel) of the multilayered magnetic thin-film stack according to the comparative embodiment shown in FIG. 3B and a XRD pattern (shown at right panel) of the multilayered magnetic thin-film stack according to an embodiment shown in FIG. 3A.

FIG. 5 is a graph showing a XRD pattern (shown on left panel) of the multilayered magnetic thin-film stack 2000R1 according to the comparative embodiment shown in FIG. 3B and a XRD pattern (shown on right panel) of the multilayered magnetic thin-film stack 2000 according to an embodiment of the present invention shown in FIG. 3A. Curves R1 through R3 respectively indicate XRD patterns of the multilayered magnetic thin-film stack 2000R1 in the as-deposited state, the state after being annealed at 300° C., and the state after being annealed at 400° C., whereas curves E1 through E3 respectively indicate XRD patterns of the multilayered magnetic thin-film stack 2000R1 in the as-deposited state, the state after being annealed at 300° C., and the state after being annealed at 400° C. Thickness of both a MgO tunneling barrier layer and a first magnetic layer containing CoFeB of the analyzed multilayered magnetic thin-film stack is about 10 nm.

Referring to the curves R1 and E1, since no peak of the CoFeB magnetic layer 222 was observed from both the multilayered magnetic thin-film stacks 2000R1 and 2000, the CoFeB magnetic layer 222 was in amorphous state. However, referring to the curve R2, a peak related to bcc CoFe (110) was observed at the multilayered magnetic thin-film stack 2000R1 after the multilayered magnetic thin-film stack 2000R1 was annealed at 300° C. for about one hour. However, referring to the curve E2, no peak related to CoFe (110) appeared at the multilayered magnetic thin-film stack 2000.

Referring to the curve R3, a strong peak of bcc (110), which is the close-packed growth plane of a CoFe layer, appeared at the multilayered magnetic thin-film stack 2000R1 after the multilayered magnetic thin-film stack 2000R1 was annealed at 400° C. for about one hour, and the crystallization may be originated from the interface between [Pt/Co]$_6$ and CoFeB magnetic layers. On the other hand, referring to the curve E3, a single peak of CoFe bcc (001) was observed at the multilayered magnetic thin-film stack 2000 according to an embodiment of the present invention, where a template effect of the MgO (001) affecting texture of a CoFeB magnetic layer is maintained and strengthened. Therefore, it is clear that the FeZr alloy layer 221 featuring a high crystallizing temperature structurally decouples the CoFeB magnetic layer 222, which is the first magnetic layer 222, from the close-packed structure of an adjacent [Pt/Co]$_6$ multilayered metal layer, which is the second magnetic layer 223, thereby preventing crystallization of the CoFeB magnetic layer 222 and promoting formation of CoFe bcc (001) in the CoFeB magnetic layer 222.

Average thickness of the FeZr alloy layer 221 may be from about 0.2 nm to about 3 nm. As thickness of the FeZr alloy layer 221 increases, structural decoupling between the first magnetic layer 222 and the second magnetic layer 223 may become more enhanced. Therefore, further the formation of bcc (001) texture of a CoFe layer may be promoted. However, if average thickness of the FeZr alloy layer 221 exceeds 3 nm, PMA property of a multilayered magnetic thin-film stack may be deteriorated. If average thickness of the FeZr alloy layer 221 is below 0.2 nm, it is difficult to obtain continuous thin-films, and thus the effect of structural decoupling may not be obtained.

Figure 6:
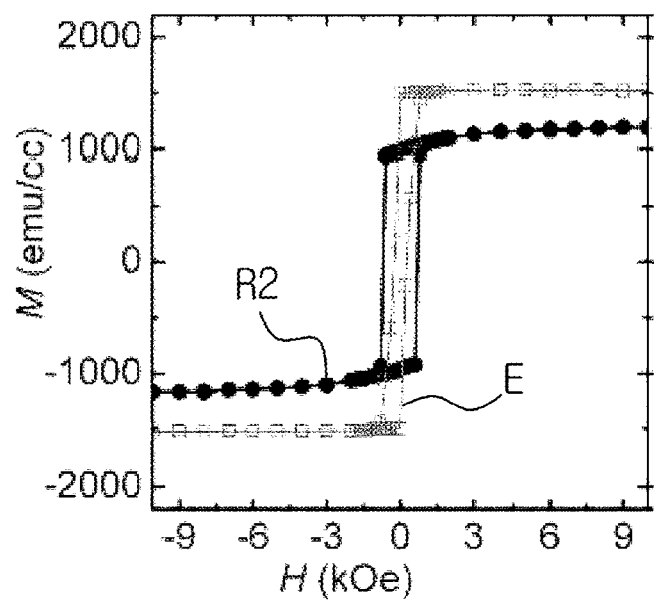
FIG. 6 is a graph showing out-of-plane M-H loop properties of the multilayered magnetic thin-film stack according to an embodiment shown in FIG. 3A and the multilayered magnetic thin-film stack according to the second comparative embodiment shown in FIG. 3C, respectively.

FIG. 6 is a graph showing out-of-plane M-H loop properties of the multilayered magnetic thin-film stack 2000 according to an embodiment of the present invention shown in FIG. 3A and the multilayered magnetic thin-film stack 2000R2 according to the second comparative embodiment shown in FIG. 3C, respectively. Magnetic properties of the multilayered magnetic thin-film stacks 2000 and 2000R2 are all measured in the as-deposited state. In this case, the CoFeB magnetic layer 222 exhibits a horizontal magnetic anisotropy. Thickness of a Ta insertion layer 221' of the multilayered magnetic thin-film stack 2000R2 according to the second comparative embodiment is about 1 nm, thickness of the FeZr alloy layer 221 according to an embodiment of the present invention is about 1 nm, and respective thicknesses of the CoFeB magnetic layer 222 and the MgO tunneling barrier layer 210 are about 1 nm and about 3 nm.

Referring to FIG. 6, the property R2 of the multilayered magnetic thin-film stack 2000R2 according to the second comparative embodiment does not have a sharp rectangular loop and exhibits a remanence ratio of about 0.83, where M gradually decreases from saturated magnetization value Ms as H decreases from a saturated value (Hs). These properties of the multilayered magnetic thin-film stack 2000R2 support that the CoFeB magnetic layer 222 exhibits in-plane magnetic anisotropy. It is because no magnetic coupling occurs between the [Pt/Co]$_6$ multilayered metal thin-film 223 and the CoFeB magnetic layer 222 due to a large thickness of the Ta insertion layer 221', which is a non-magnetic layer.

However, the property E of the multilayered magnetic thin-film stack 2000 according to an embodiment of the present invention has a substantially sharp rectangular loop property based on PMA and shows a high effective PMA energy density $K_{eff}$ of about $5.6 \times 10^6$ erg/cm$^3$. In the multilayered magnetic thin-film stack 2000, although the CoFeB magnetic layer 222 in the as-deposited state has horizontal magnetic anisotropy property, perpendicular magnetic anisotropy may be observed, since the [Pt/Co]$_6$ multilayered metal thin-film exhibits strong PMA and the strong PMA of the [Pt/Co]$_6$ multilayered metal thin-film 223 may be delivered to the CoFeB magnetic layer 222 via the FeZr alloy layer 221.

Considering that contribution ratio of the CoFeB magnetic layer 222 was about 17% and contribution ratio of the [Pt/Co]6 multilayered metal thin-film 223 was about 83% based on an observed remnant magnetization ratio, unlike in the multilayered magnetic thin-film stack 2000R2 according to the second comparative embodiment employing the Ta insertion layer 221' having thickness of about 1 nm, the FeZr alloy layer 221 having the same thickness of 1 nm induced magnetic coupling between the [Pt/Co]$_6$ multilayered metal thin-film 223 and the CoFeB magnetic layer 222 in the multilayered magnetic thin-film stack 2000 according to an embodiment of the present invention. The reason thereof is that, although the saturated magnetization value Ms of the FeZr alloy layer 221 in the as-deposited state is relatively small (about 35 emu/cm3), the FeZr alloy layer 221 is a magnetic layer, thus enabling the magnetic coupling therebetween.

Furthermore, the saturated magnetization value Ms of the multilayered magnetic thin-film stack 2000 according to an embodiment of the present invention is 1,527 emu/cm$^3$, which is significantly greater than the saturated magnetization value Ms of the multilayered magnetic thin-film stack 2000R2 according to the second comparative embodiment employing the Ta insertion layer 211', which is 1,189 emu/cm$^3$. It is estimated that, the difference is based on magnetic coupling between adjacent layers via the FeZr alloy layer 221 which is a magnetic layer, in the multilayered magnetic thin-film stack 2000 according to an embodiment of the present invention. However, formation of a magnetic dead layer at interfaces contacting the adjacent layers 222 and 223 in the multilayered magnetic thin-film stack 2000R2 according to the second comparative embodiment employing the Ta insertion layer 211'.

Figure 7:
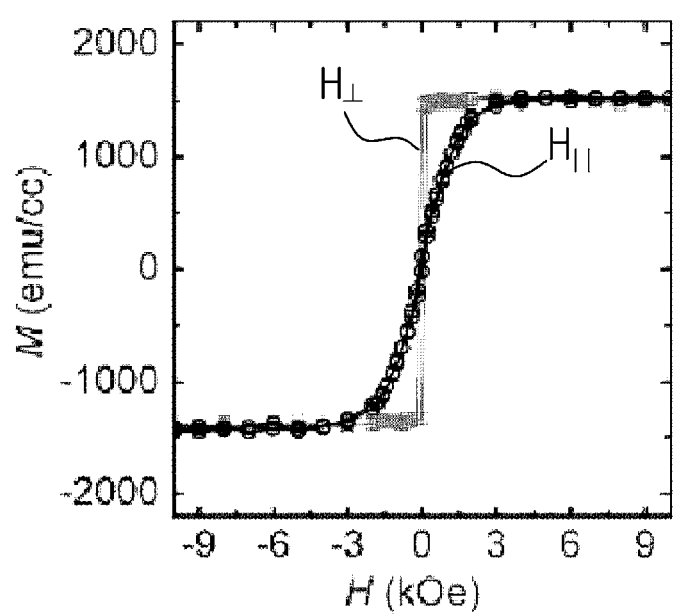
FIG. 7 is a graph showing out-of-plane ($H_\perp$) and in-plane ($H_\parallel$) M-H loops measured on the FeZr alloy layer (thickness is about 1 nm)/the CoFeB magnetic layer (thickness is about 1 nm)/and the MgO tunneling barrier layer (thickness is about 1 nm) that were applied to the other multilayered magnetic thin-film stack of FIG. 3A, according to an embodiment of the present invention.

FIG. 7 is a graph showing out-of-plane ($H_\perp$) and in-plane ($H_\parallel$) M-H loops measured with respect to the FeZr alloy layer 221 (thickness is about 1 nm)/the CoFeB magnetic layer 222 (thickness is about 1 nm)/and the MgO tunneling barrier layer (thickness is about 1 nm) that were applied to the other multilayered magnetic thin-film stack 2000 of FIG. 3A, according to an embodiment of the present invention. The multilayered magnetic thin-film stack 2000 was annealed at a temperature of about 400° C. Compared to the multilayered magnetic thin-film stack of FIG. 6, the MgO tunneling barrier layer 210 is deposited to have thickness of about 1 nm.

To detect an effect related to the FeZr alloy layer 221 only, the multilayered magnetic thin-film stack measured in FIG. 7 is formed by removing the [Pt/Co]$_6$ multilayered structure 223, which is the second magnetic layer 223, is removed from the multilayered magnetic thin-film stack 2000 of FIG. 3A. In other words, the measured multilayered magnetic thin-film stack is a magnetic thin-film stack having a multilayered structure of a Si substrate/Ta (about 5 nm)/Pt (about 10 nm)/Ru (about 30 nm)/FeZr (about 1 nm)/CoFeB (about 1 nm)/MgO (about 1 nm)/Ru (about 3 nm). As supported by FIG. 7, a CoFeB magnetic layer attached to a FeZr alloy layer shows a complete PMA property. Therefore, it should be noted that a FeZr alloy layer according to an embodiment of the present invention is effective to obtain a magnetic layer having (001) bcc structure such as a CoFeB layer and exhibits strong PMA property, together with a MgO tunneling barrier layer.

Figure 8A:
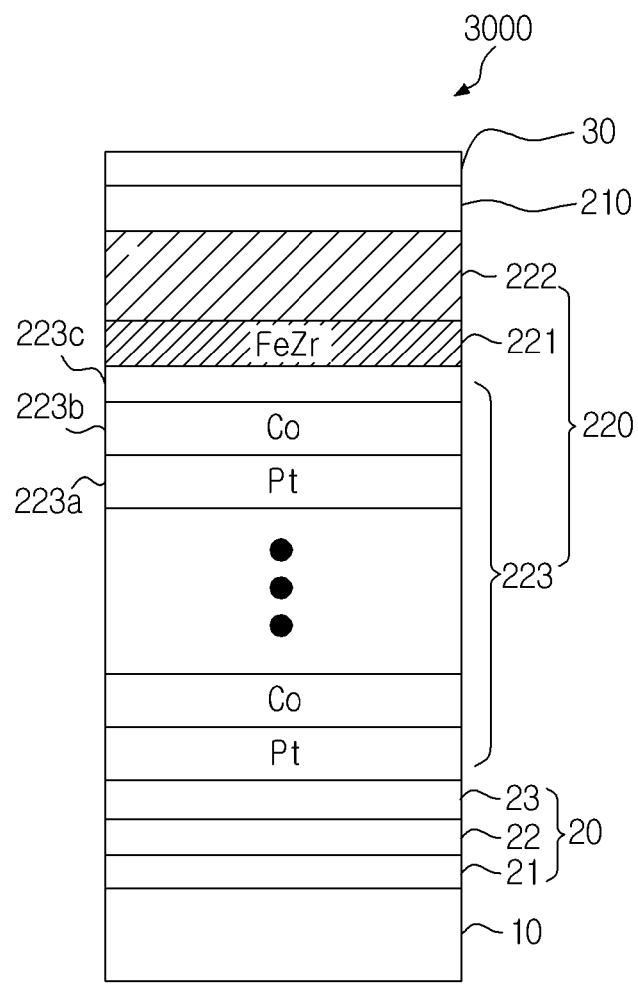
FIG. 8A is a diagram showing a multilayered magnetic thin-film stack according to another embodiment of the present invention.
Figure 8B:
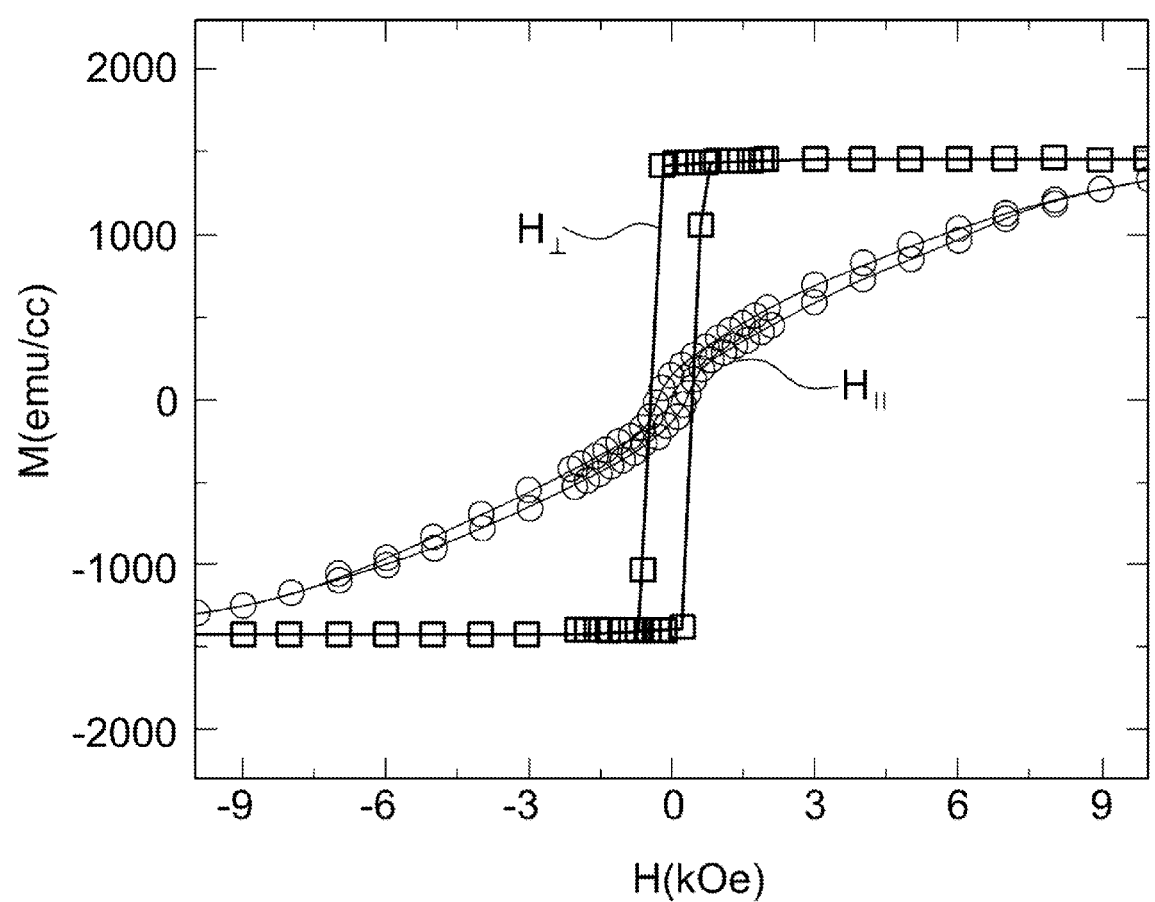
FIGS. 8B and 8C are graphs showing M-H measurement results regarding the multilayered magnetic thin-film stack in the as-deposited state and the annealed state at about 400° C., respectively; and, FIG. 9 is a block diagram showing an electronic system including a non-volatile memory device according to an embodiment of the present invention.
Figure 8C:
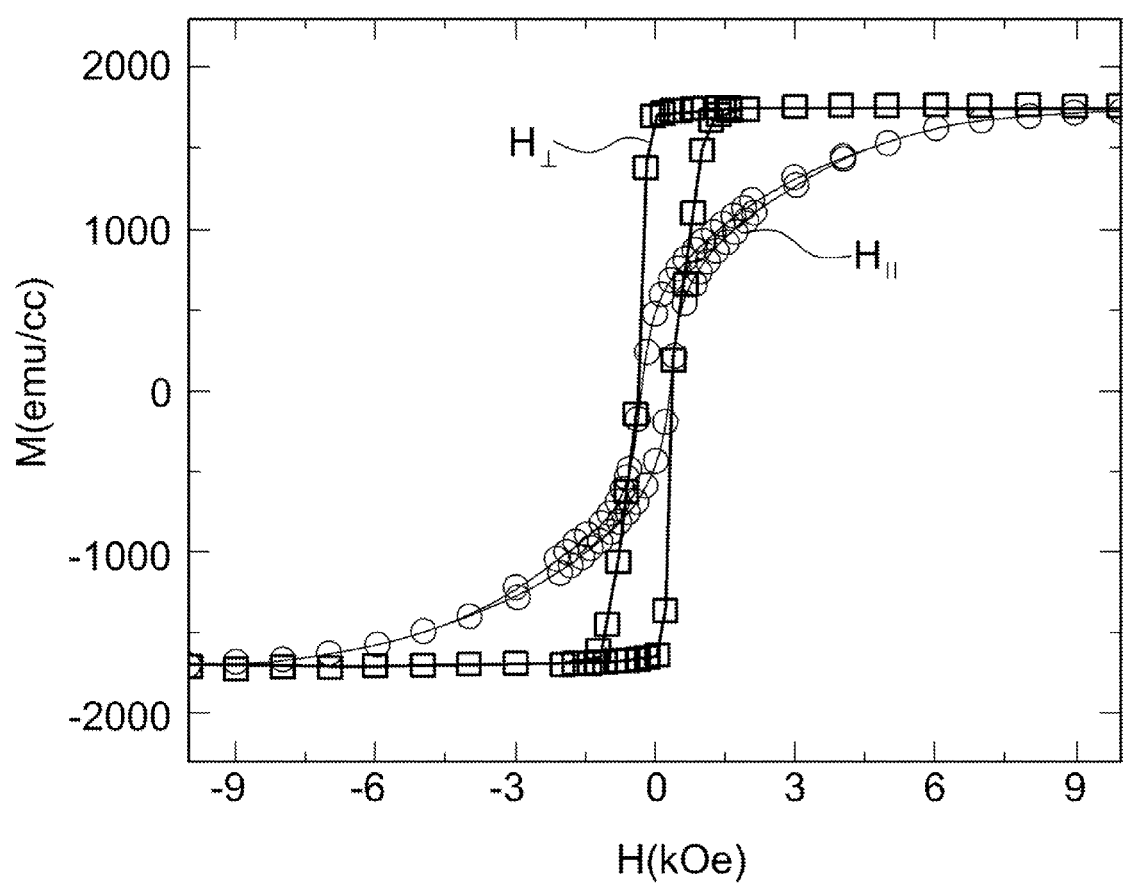

FIG. 8A is a diagram showing a multilayered magnetic thin-film stack 3000 according to another embodiment of the present invention, and FIGS. 8B and 8C are graphs showing M-H measurement results regarding the multilayered magnetic thin-film stack 3000 in the as-deposited state and the state after being annealed at 400° C., respectively. As shown in FIG. 8A, the multilayered magnetic thin-film stack 3000 is a magnetic thin-film stack having a multilayered structure of a Si substrate having formed thereon the oxide layer 10/a Ta layer 21 (thickness is about 5 nm)/a Pt layer 22 (thickness is about 10 nm)/a Ru layer 23 (thickness is about 30 nm)/a [Pt/Co]$_6$ layer 223/a Pt layer 223c/a FeZr layer 221 (thickness is about 1 nm)/a CoFeB layer 222 (thickness is about 1 nm)/a MgO layer 210 (thickness is about 1 nm)/a Ru layer 30 (thickness is about 3 nm), where the Pt layer 223c, which is the buffer layer, is interposed between a FeZr alloy layer 223 and a [Pt/Co]$_6$ multilayered metal thin-film, which is the third magnetic layer 223.

In the MTJ stack 3000 according to the present embodiment, the [Pt/Co]$_6$ multilayered magnetic thin-film, which is the third magnetic layer 223, enhances PMA property of the overall MTJ stack as described above with reference to FIGS. 6 and 7. Since the [Pt/Co]$_6$ multilayered metal thin-film 223 exhibits PMA property based on interfacial anisotropy, it is expected to improve PMA property by arranging a suitable buffer layer between the [Pt/Co]$_6$ multilayered metal thin-film 223 and the FeZr alloy layer 221/CoFeB magnetic layer 222 or between the [Pt/Co]$_6$ multilayered metal thin-film 223 and the CoFeB magnetic layer 222.

Referring to FIGS. 8B and 8C, in case of the MTJ stack 3000 including the Pt layer 223c/FeZr alloy layer 221, out-of-plane M-H property and in-plane M-H property of the MTJ stack 3000 in the as-deposited state barely differ from those of the MTJ stack 3000 after being annealed at 400° C. Furthermore, the effective PMA energy density $K_{eff}$ of the multilayered magnetic thin-film stack according to the present embodiment in the as-deposited state is 7.9×10$^6$ erg/cm$^3$, whereas the effective PMA energy density $K_{eff}$ of the multilayered magnetic thin-film stack according to the present embodiment in the state after being annealed at 400° C. is 3.9×10$^6$ erg/cm$^3$.

After an annealing operation, the saturated magnetization value Ms increases from 1,482 emu/cm$^3$ to 1,733 emu/cm$^3$. It is since the saturated magnetization value Ms of the FeZr alloy layer 221 increases as boron of a CoFeB thin-film diffuses into the FeZr alloy layer 221. The diffusion of boron may not only promote the CoFe magnetic layer 221 to have (001) bcc texture, but also favor the FeZr alloy layer 221 to maintain an amorphous structure.

Various MTJs described above with reference to the drawings attached to the present specification may be implemented as a single memory device or in the form of system-on-chip (SOC) by being arranged together with other types of devices, e.g., a logic processor, an image sensor, a RF device, etc., within a single wafer chip. Alternatively, a wafer chip having formed thereon a non-volatile memory device and another wafer chip having formed thereon other types of devices may be adhered to each other by using an adhesive layer, a soldering, or a wafer bonding technique, thereby embodying a single chip by using a technique, such as through silicon via. Furthermore, resistance changing property of a MTJ may be utilized as a fuse or an anti-fuse in other devices including a logic processor.

Furthermore, the memory devices according to the above-stated embodiments may be embodied as any of various types of semiconductor packages. For example, 3D non-volatile memory devices according to embodiments may be packaged as package on package (PoP), ball grid arrays (BGAs), chip scale packages (CSPs), plastic leaded chip carrier (PLCC), plastic dual in-line package (PDIP), die in waffle pack, die in wafer FoSM, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP). Packages on which memory devices according to embodiments are mounted may further include controllers and/or logic devices for controlling the memory devices.

Figure 9:
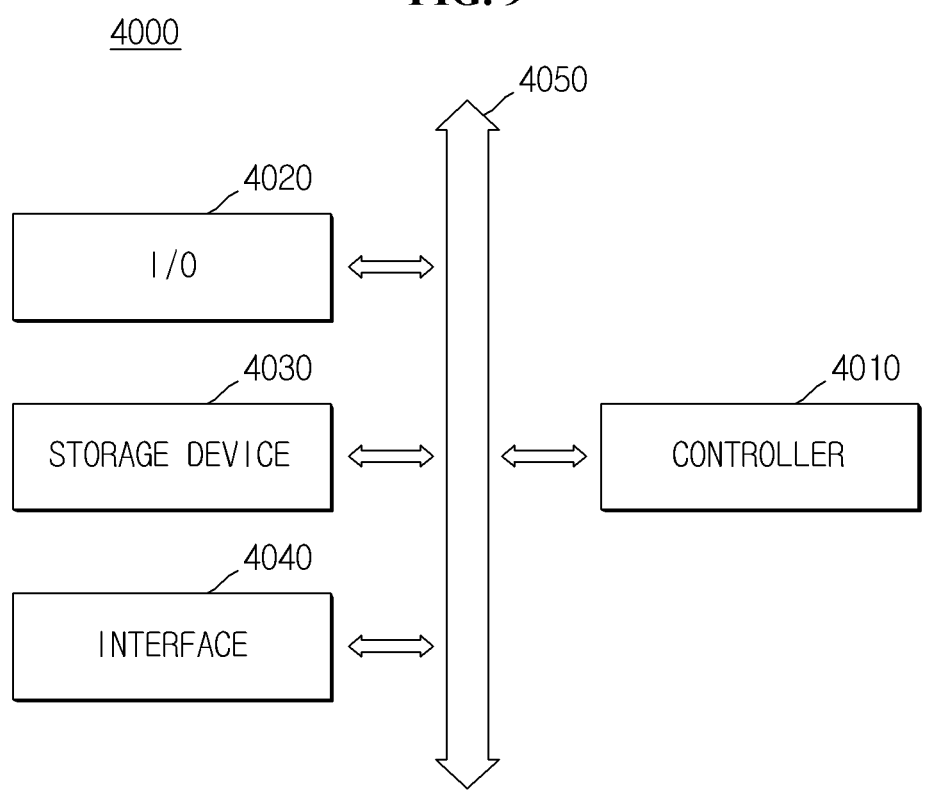

FIG. 9 is a block diagram showing an electronic system 4000 including a non-volatile memory device according to an embodiment of the present invention.

Referring to FIG. 9, the electronic system 4000 may include a controller 4010, an I/O device 4020, a storage device 4030, an interface 4040, and a bus 4050. The controller 4010, the I/O device 4020, the storage device 4030, and/or the interface 4040 may be combined with one another via the bus 4050. The bus 4050 may be a single bus or a complexed bus.

The controller 4010 may include at least one from among a microprocessor, a digital signal processor, a micro controller, and other logic devices providing similar functions. The I/O device 4020 may include a keypad, a keyboard, a display device, etc. The storage device 4030 may store data and/or instructions. The storage device 4030 may include memory cells including MTJs or multilayered magnetic thin-film stacks according to various embodiments disclosed in the present specification.

According to embodiments, the memory device 4030 may have a hybrid structure further including other types of semiconductor memory devices (e.g., DRAM devices and/or SRAM devices). The interface 4040 may transmit data to a communication network or receive data from a communication network. The interface 4040 may be a wired interface or a wireless interface. For example, the interface 4040 may include an antenna or a wired/wireless transceiver. Although not shown, the electronic system 4000 may further include a high speed DRAM and/or SRAM as an operation memory for improving operation of the controller 4010.

The electronic system 4000 may be applied to a personal digital assistant (PDA), a portable computer, a tablet PC, a wireless phone, a mobile phone, a digital music player, a memory card, a solid-state drive (SSD), a computer, a display device, an input unit, such as a digitizer and a mouse, or any of various other electronic devices capable of transmitting and/or receiving data wirelessly.

According to an embodiment of the present invention, as at least one of a magnetic pinned layer and a magnetic free layer constituting a MTJ includes a magnetic layer having a structure exhibiting high PMA and stably maintains the (001) structure, low interfacial anisotropy and thermal stability of the a MTJ may be improved, thereby providing a multilayered magnetic thin-film stack having reliable data storage property and high data retention property.

Furthermore, according to another embodiment of the present invention, a FeZr alloy layer structurally decouples magnetic layers adjacent to each other from each other, while the FeZr alloy layer may also magnetically couples the magnetic layers to each other, and thus a multilayered magnetic thin-film stack with easily controllable magnetic structure properties may be provided.

Furthermore, according to another embodiment of the present invention, a non-volatile memory device including a multilayered magnetic thin-film stack exhibiting the above-stated benefits may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A multilayered magnetic thin-film stack comprising:
a tunneling barrier layer;
a magnetic pinned layer disposed on a first surface of the tunneling barrier layer; and
a magnetic free layer disposed on a second surface of the tunneling barrier layer, wherein the second surface is opposite to the first surface,
wherein at least one of the magnetic pinned layer and the magnetic free layer comprises a FeZr alloy layer and a first magnetic layer having a (001) body-centered cubic (bcc) structure between the FeZr alloy layer and the tunneling barrier layer,
wherein the FeZr alloy layer has a mixed crystalline phase including bcc Fe and hexagonal close-packed (hcp) Zr,
wherein the FeZr alloy layer has a first surface on which the first magnetic layer is disposed, and a second surface opposite to the first surface of the FeZr alloy layer, and the multilayered magnetic thin-film stack further comprises a second magnetic layer disposed on the second surface of the FeZr alloy layer,
wherein the second magnetic layer comprises a multilayered structure, the multilayered structure comprising a super-lattice structure including at least one non-magnetic metal layer and at least one cobalt (Co)-containing magnetic layer alternately stacked with the at least one non-magnetic metal layer, the at least one non-magnetic metal layer comprising Platinum (Pt), rhodium (Rh), hafnium (Hf), palladium (Pd), tantalum (Ta), osmium (Os), germanium (Ge), iridium Or), gold (Au), silver (Ag), or an alloy thereof, the first magnetic layer and the second magnetic layer being magnetically coupled via the FeZr alloy layer so that a stack comprising the first magnetic layer, the FeZr alloy layer, and the second magnetic layer functions as a ferromagnetic layer, and
wherein the multilayered structure has a face-centered cubic (fcc) (111) close-packed growth crystalline plane.

2. The multilayered magnetic thin-film stack of claim 1, wherein the tunneling barrier layer comprises aluminum oxide ($Al_2O_3$), magnesium oxide (MgO), titanium oxide ($TiO_2$), aluminum nitride (AlN), ruthenium oxide ($RuO_2$), strontium oxide (SrO), silicon nitride (SiN), calcium oxide (CaO), hafnium oxide ($HfO_2$), tantalum oxide ($Ta_2O_5$), zirconium oxide ($ZrO_2$), silicon carbide (SiC), silicon oxide ($SiO_2$), silicon oxynitride ($SiO_xN_y$), or a stack of thin films formed of two or more thereof.

3. The multilayered magnetic thin-film stack of claim 1, wherein atomic mole ratio of zirconium (Zr) in the FeZr alloy layer is from about 25 atomic % to about 75 atomic %.

4. The multilayered magnetic thin-film stack of claim 1, wherein average thickness of the FeZr alloy layer is from about 0.2 nm to about 3 nm.

5. The multilayered magnetic thin-film stack of claim 1, wherein the first magnetic layer comprises a pure iron (Fe), cobalt-iron (CoFe), cobalt-iron-boron (CoFeB), or a stacked layer containing two or more of the same.

6. The multilayered magnetic thin-film stack of claim 1, wherein the tunneling barrier layer comprises MgO (001), and the first magnetic layer comprises at least one of cobalt-iron-boron (CoFeB) and cobalt-iron (CoFe).

7. A non-volatile memory device comprising the multilayered magnetic thin-film stack of claim 1.

8. The multilayered magnetic thin-film stack of claim 1, wherein the second surface of the FeZr alloy layer is interfaced with a first cobalt (Co)-containing magnetic layer of the multilayered structure.

9. A multilayered magnetic thin-film stack comprising:
a ferromagnetic layer including a stack, the stack comprising:
a first magnetic layer and a second magnetic layer adjacent to each other; and a FeZr alloy layer inserted between the first magnetic layer and the second magnetic layer, the FeZr alloy layer structurally decoupling the first magnetic layer and the second magnetic layer from each other, and magnetically coupling the first magnetic layer and the second magnetic layer to each other, wherein the FeZr alloy layer has a mixed crystalline phase including body-centered cubic (bcc) Fe and hexagonal close-packed (hcp) Zr, wherein the FeZr alloy layer has a first surface on which the first magnetic layer is disposed, and a second surface opposite to the first surface of the FeZr alloy layer, the second magnetic layer being disposed on the second surface of the FeZr alloy layer, wherein the second magnetic layer comprises a multilayered structure, the multilayered structure comprising a super-lattice structure including at least one non-magnetic metal layer and at least one cobalt (Co)-containing magnetic layer alternately stacked with the at least one non-magnetic metal layer, the at least one non-magnetic metal layer comprising Platinum (Pt), rhodium (Rh), hafnium (Hf), palladium (Pd), tantalum (Ta), osmium (Os), germanium (Ge( iridium (Irf gold (Au), silver (Ag), or an alloy thereof and wherein the multilayered structure has a face-centered cubic (fcc) (111) close-packed growth crystalline plane.

10. The multilayered magnetic thin-film stack of claim 9, wherein the second surface of the FeZr alloy layer is interfaced with a first cobalt (Co)-containing magnetic layer of the multilayered structure.

11. The multilayered magnetic thin-film stack of claim 9, wherein the first magnetic layer has a (001) bcc structure, wherein the multilayered magnetic thin-film stack further comprises a template layer for crystallization of the first magnetic layer on a surface of the first magnetic layer opposite to the surface of the first magnetic layer contacting the FeZr alloy layer.

12. The multilayered magnetic thin-film stack of claim 11, wherein the template layer comprises MgO (001).

13. The multilayered magnetic thin-film stack of claim 12, wherein the multilayered magnetic thin-film stack has perpendicular magnetic anisotropy.

14. The multilayered magnetic thin-film stack of claim 9, wherein atomic mole ratio of zirconium (Zr) in the FeZr alloy layer is from about 25 atomic % to about 75 atomic %.

15. The multilayered magnetic thin-film stack of claim 9, wherein average thickness of the FeZr alloy layer is from about 0.2 nm to about 3 nm.

16. The multilayered magnetic thin-film stack of claim 9, wherein the first magnetic layer comprises a ferromagnetic layer.

17. The multilayered magnetic thin-film stack of claim 10, wherein the first magnetic layer comprises at least one of CoFeB and CoFe.

18. A non-volatile memory device comprising the multilayered magnetic thin-film stack of claim 9.

* * * * *